United States Patent [19]
Hofland et al.

[11] Patent Number: 5,800,354
[45] Date of Patent: Sep. 1, 1998

[54] METHOD OF AND DEVICE FOR MAGNETIC RESONANCE IMAGING

[75] Inventors: Lennart Hofland, Eindhoven, Netherlands; Bernard J. Savord, Andover; Steven A. Scampini, Bedford, both of Mass.

[73] Assignees: U.S. Phillips Corporation, New York, N.Y.; Hewlett-Packard, Palo Alto, Calif.

[21] Appl. No.: 345,026

[22] Filed: Nov. 23, 1994

[51] Int. Cl.⁶ .................................................. A61B 5/055
[52] U.S. Cl. ................................................. 600/410; 324/309
[58] Field of Search ........................... 128/653.2, 653.3, 128/653.5, 696, 708, 721; 324/309; 600/410, 419, 421, 509, 521, 534

[56] References Cited

U.S. PATENT DOCUMENTS

| | | | |
|---|---|---|---|
| 4,905,699 | 3/1990 | Sano et al. | 128/653 A |
| 4,937,526 | 6/1990 | Ehman et al. | 324/309 |
| 4,994,743 | 2/1991 | Glover et al. | 324/309 |
| 4,995,394 | 2/1991 | Cline et al. | 128/653 A |
| 5,042,485 | 8/1991 | Sano et al. | 128/653 A |
| 5,185,574 | 2/1993 | Ehman et al. | 324/309 |
| 5,277,192 | 1/1994 | Dumoulin | 128/653.3 |
| 5,363,844 | 11/1994 | Riederer et al. | 128/653.2 |
| 5,382,902 | 1/1995 | Taniguchi et al. | 324/309 |
| 5,427,101 | 6/1995 | Sachs et al. | 128/653.2 |

OTHER PUBLICATIONS

"Respiratory Ordered Phase Encoding (ROPE)", By D.R. Bailes et al., Published in Journal of Computer Assisted Tomography, 1985, No. 9, pp. 835–838.

*Primary Examiner*—Brian Casler
*Attorney, Agent, or Firm*—Jack D. Slobod

[57] ABSTRACT

In a magnetic resonance method for imaging of a moving part of a body (106) temporary magnetic gradient fields (230) are applied and a echo signal (641, 642) is obtained after an excitation pulse (201). An image of the moving part is reconstructed from the received echo signals (240). The moving part introduces artefacts in the reconstructed image. These artefacts could be reduced when the instantaneous position of the moving part is known and the region of the moving part to be excited is adjusted according to this instantaneous position. This instantaneous position is derived from navigator signals (640). These navigator signals (640) could be generated independently from the other echo signals (641, 642) in the moving part of the body. A further reduction of artefacts in the image could be obtained by deriving a phase correction and a frequency correction from the navigator signals (640) and to apply the derived corrections to the received echo signals (641, 642). Also this method could be combined with ECG-triggering and respiratory gating.

18 Claims, 5 Drawing Sheets

METHOD OF AND DEVICE FOR MAGNETIC RESONANCE IMAGING

BACKGROUND OF THE INVENTION

1. Field of the Invention

The invention relates to a method of forming magnetic resonance images of a moving part of a body, which part moves in a first direction and is arranged in a substantially uniform, steady magnetic field, MR signals being generated in the body by application of pulse sequences comprising RF pulses and temporary magnetic gradient fields, said MR signals containing position-dependent information wherefrom subsequently an image is reconstructed, which method includes the steps of determining a position of the moving part, adjusting a position of a region to be excited in a space within the uniform magnetic field in conformity with the position determined for the moving part, generating and receiving MR signals, and processing the received MR signals so as to form an image.

The invention also relates to a device for forming magnetic resonance images of a moving part of a body which is arranged in a substantially uniform steady magnetic field, which device includes means for sustaining the steady magnetic field, means for generating RF electromagnetic signals, and means for generating temporary magnetic gradient fields, a control unit for generating control signals for the aforementioned means means for receiving, demodulating and sampling the MR signals, and a processing unit for processing the sampled MR signals.

2. Description of the Related Art

A method of this kind is known from German Patent Specification DE-A3918625 which corresponds to U.S. Pat. No. 5,042,485. The known method is used to counteract motion artifacts in magnetic resonance images, for example MR images of the coronary artery. The motion artifacts are caused in that the position of the region to be imaged deviates from the position of the excited region. The deviation is caused, for example, by cardiac motion. Therefore, the known method utilizes an ECG to derive the position of the moving part. Subsequently, using the, derived position, the region to be excited is adjusted to the moving part in the body.

It is a drawback of the known method that the position derived from the ECG could deviate from the actual position of the moving part in the body. This is inter alia due to the fact that there is not always an unambiguous relationship between the ECG and the cardiac motion. In such a situation an incorrect position of the region to be excited is adjusted in the body, and motion artifacts will still occur in the MR image.

SUMMARY OF THE INVENTION

It is inter alia an object of the invention to improve the MR image by improved measurement of the position of the moving part. The improved measurement enables the region to be excited to be more accurately adjusted to the region to be imaged, so that fewer motion artifacts will be visible in the MR image of the moving part and motional unsharpness will be substantially eliminated.

A method of the kind set forth in accordance with the invention is characterized in that in order to determinate the position of the moving part the following sub-steps are executed:

a) generating a navigator signal in the body and in the moving part, b) receiving the navigator signal, and c) determining the position of the moving part from the navigator signal received.

These steps directly determine the position of the moving part and the region to be imaged can thus correspond substantially completely to the excited region. Moreover, the excited region can be continuously adapted to the instantaneous position of the moving part if navigator signals are rapidly generated and processed.

The navigator signal is an MR signal which is generated in a region of the body by means of a pulse sequence. This region includes the moving part, moving in a first direction, and an adjoining part of the body. The navigator signal is generated in a manner independent of other spatially encoded MR signals. Furthermore, the navigator signal contains only a frequency encoding which is applied by a magnetic gradient field during the reception of the navigator signal, the gradient of the magnetic gradient field then being oriented in the first direction. Subsequently, a one-dimensional Fourier transformation is applied to the navigator signal received in order to obtain a 1D proton density profile of the region along the axis in the first direction. Subsequently, the position of the moving part is determined from the 1D proton density profile.

In the context of the present invention the term navigator signal also designates other MR signals which are generated in a body so as to measure a position of a moving part of the body. An example in this respect is a two dimensional RF navigator signal generated in a column extending parallel to a direction of motion, the column covering the moving part and an adjoining part of the body.

A method which utilizes navigator signals for determining a position of a moving part in the body is inter alia known from U.S. Pat. No. 4,937,526. However, this known method utilizes the navigator signals to derive a phase correction from the position determined, the received and modulated MR signals being corrected on the basis thereof at a later stage. Also the navigator signals are not generated independently of the MR signals to be used for the image reconstruction.

Another method of reducing artifacts in MR images of a moving part is the so-called "Respiratory Ordered Phase Encoding" method. This ROPE method is known from the article "Respiratory Ordered Phase Encoding (ROPE)", by D. R. Bailes et al., published in Journal of Computer Assisted Tomography, 1985, No. 9, pp. 835–838. According to the ROPE method, during the generating of MR signals in a so-called Single Echo Multiple Shot (SEMS) method the phase encoding gradient is selected in the direction of a cyclic motion in the moving part. In order to counteract motion artifacts due to the cyclic motion, the phase to be used for the phase encoding for the echo signal to be generated is estimated from the cyclic motion of the moving part. It is a drawback of this method that the extrapolation can result in an incorrect position in the case of irregular respiration, so that the estimated position deviates from the actual position, motion artifacts occur as yet in the MR image, and the phase encoding direction must be chosen to extend in the direction of motion, this implies a restriction in respect of the imaging of slices which do not extend parallel to the direction of motion. Further ROPE does not compensate for blurring due to trough-plane motion of small objects.

According to the invention a navigator signal can also be used to compensate for a moving part of a body only by means of a compensation of phase and/or frequency of the MR-signals. In such situation the method is characterized in that to compensate for motion artifacts in an image of a region of the moving part the following sub-steps are executed:

a) generating a navigator signal in the body and in the moving part,
b) receiving a navigator signal,
c) determining a phase correction and/or frequency correction from the navigator signal received, and
d) executing the phase correction and/or frequency correction on the received signals.

These steps enable a compensation for a motion having no components in the first direction or the component in the first direction is of no relevance for the imaging process. The two not orthogonal components of this motion could then be compensated by only a phase correction and/or a frequency correction to the spatially encoded MR-signals. This navigator signal is also generated independently of other spatially encoded MR signals. Furthermore, the navigator signal contains only a frequency encoding which is applied by a magnetic gradient field during the reception of the navigator signal, the gradient of the magnetic gradient field then being oriented in the first direction.

A special version of the method in accordance with the invention is characterized in that for the execution of a motion correction in the image of the excited region of the moving part of the body, the following steps are also executed:

a) determining a phase correction and/or frequency correction from the navigator signals received, and
b) executing the phase correction and/or frequency correction on the received MR signals.

This step enables compensation for motion artifacts in an image of a region of the moving part when the direction of the motion is not substantially perpendicular to the region to be imaged. The motion then has components in three orthogonal directions in a coordinate system of the region to be imaged. A first component is compensated by the tracking of the region to be imaged by the region to be excited. The components in the second and the third direction, both perpendicular to the first component, are corrected by application of phase corrections and/or frequency corrections to the spatially encoded MR signals.

A method in which navigator signals are used to determine a phase correction and to apply motion compensation is known from U.S. Pat. No. 4,937,526. This Specification describes a phase correction for a two-dimensional Fourier imaging technique and a three-dimensional Fourier imaging technique, which phase correction is applied to the MR signals after reception and demodulation. However, in the 2D Fourier imaging technique for a slice correction is possible only for a motion component in a plane parallel to the slice, so that the orientation of a slice must be selected to extend in the dominant direction of motion. Moreover, in the 3D Fourier imaging technique the entire organ must be present within the scan volume. Both conditions represent a restriction to, for example the 2D Fourier imaging technique for multi-layer "inflow MR angio". In a method in accordance with the invention, the 2D Fourier imaging technique can still be used for the multi-layer inflow MR angio technique where compensation is still possible for the imaging of a slice not extending in the dominant direction of motion.

A further version of the method of the invention is characterized in that, in order to counteract motion artifacts caused by cardiac motions navigator signals and MR signals are generated in the moving part exclusively during an acquisition period of the cardiac motion, an ECG being recorded in order to determine an acquisition period.

This method counteracts motion artifacts which arise in the image of the moving part because of a complex cardiac motion. The MR signals are always generated in a part of the heart in approximately the same, brief phase or period of the cardiac cycle. This brief period is referred to as the acquisition period in the present Patent Application. All MR signals necessary for the reconstruction of an image of the part of the heart, therefore, are generated exclusively during this acquisition period. This method is known as "cardiac triggering". It is to be noted that the cited German Patent Specification DE-A-3918625 also utilizes an ECG which, however, is used to determine a position of the heart and not to determine a period during which MR signals are generated in the moving part.

Another version of the method of the invention is characterized in that in order to counteract artifacts caused by a recurrent motion in the body, MR signals are received exclusively during a period of motion of a reference part, the following steps are also executed:

a) deriving positions of the reference part from the navigator signals received, and
b) determining the period of motion from the derived positions of the reference part.

According to this method MR signals are generated continuously in the moving part of the body while the MR-signals are received exclusively when the moving reference part is in a substantially uniform position in the body. The advantage of the method of the invention consists in that the magnetisation of the region to be imaged will be substantially constant.

The respiratory gating method is known inter alia from U.S. Pat. No. 4,905,699. According to this method a sequence for detecting the respiratory motion is repeated for a short time immediately before the measurement of an image signal to detect the position and speed of the respiratory motion, and a desired image a desired MR signal is measured in synchronism with the detected position. Or alternatively the respirator motion is detected immediately after the measurement of a MR signal, and the measured MR-signal is corrected in accordance with the detected position to obtain a desired MR signal synchronised with the respiration. In the method of the invention a sequence for the detection of the motion is repeated for a short time before the generation of the MR-signal to be used for imaging, to detect a position to adjust the region in which MR-signals are generated, and a desired MR-signal is measured in synchronism with the detected position.

An MRI device in accordance with the invention for the compensation of motion artifacts in MR images is characterized in that the control unit is also arranged to execute the following step:

1) generating a navigator signal in the body and in the moving part,
2) receiving the navigator signal,
3) determining the position of the moving part from the navigator signal received,
4) adjusting a position of a region to be excited in a space within the uniform magnetic field in conformity with the position determined for the moving part,
5) generating and receiving MR signals, and
6) processing the MR signals received so as to form an image.

A special embodiment of an MRI device in accordance with the invention is characterized in that the control unit comprises a circuit for executing a 1D Fourier transformation on the navigator signal received, and a circuit for deriving the position of the moving part from the Fourier transformed navigator signal.

The 1D Fourier transformation can be very rapidly executed as a result of the implementation of a 1D Fourier transformation in an additional, special electronic circuit.

Moreover, the implementation of the operation of deriving a position from the result of the 1D Fourier transformation in electronic (hardware) circuits also allows for very fast determination of the position of the moving part.

Another embodiment of an MRI device in accordance with the invention is characterized in that the means for generating RF pulses comprise a control input which is coupled to a circuit for determining the position of the moving part, the response of a control signal applied to the control input containing a change of frequency of the RF pulses.

According to this step, the position determined for the region to be excited is applied directly to the means for determining the frequency contents of the RF pulses by, for example a voltage whose magnitude is proportional to the position determined. The advantage thereof consists in that the control unit need not intervene and that, moreover, no signal leads are required which are shared with the processing unit or the control unit, which sharing might cause a delay in the adjustment of the position.

BRIEF DESCRIPTION OF THE PREFERRED EMBODIMENT

The above and other, more detailed aspects of the invention will be described in detail hereinafter, by way of example, with reference to the drawing. Therein:

Figure 1:
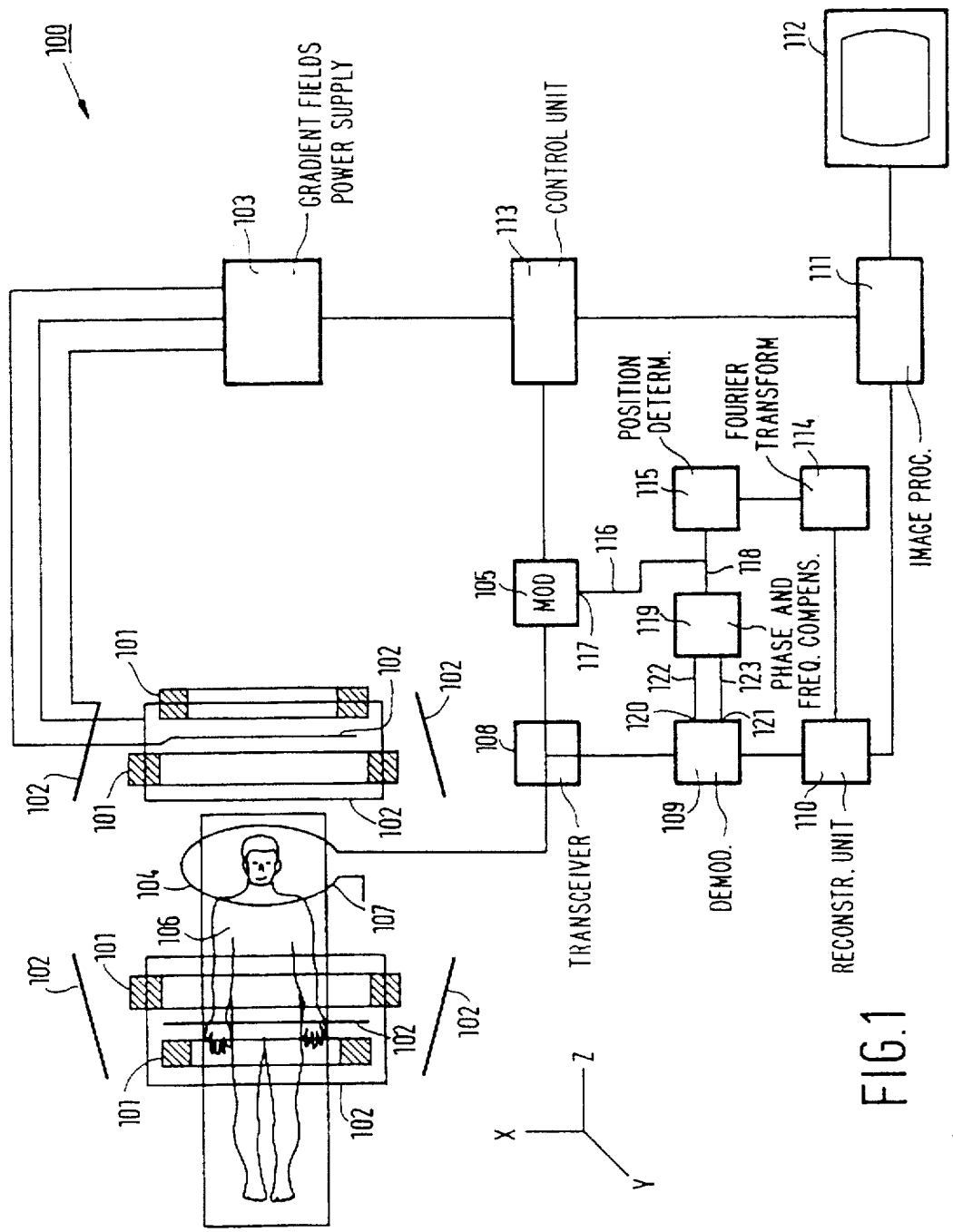
FIG. 1 shows an MRI device.

FIG. 1 shows a magnetic resonance imaging device which is known per se. The MRI device 100 comprises a first magnet system 101 for generating a steady magnetic field, a second magnet system 102 for generating temporary magnetic gradient fields in three orthogonal directions, and power supply units 103 for the second magnet system 102. The power supply for the first magnet system 101 is not shown. The system comprises an examination space which is large enough to accommodate a patient to be examined or a part of the patient to be examined. As is customary, in this Figure and in this description the z-direction of the coordinate system shown indicates the direction of the steady magnetic field. An RF transmitter coil 104 serves to generate RF fields and is connected to an RF source and modulator 105. The RF coil 104 is arranged within the examination space around or against or near a part of the patient. A receiver coil 107 is used to receive a magnetic resonance signal. This may be the same coil as the RF transmitter coil 104. The RF transceiver coil 104 is connected, via a transceiver circuit 108, to a signal amplification and demodulation unit 109. A phase and amplitude are derived from the MR signals received in the signal amplification and demodulation unit 109. Subsequently, the phase and amplitude obtained from this circuit are applied to a reconstruction unit 110. The reconstruction unit 110 processes the signals received so as to form an image. This image is made visible via an image processing unit 111, for example on a monitor 112. The magnetic resonance imaging device 100 also comprises a control unit 113. This unit controls the modulator 105 for the RF transmitter, the power supply units 103 for the temporary magnetic gradient fields, and the reconstruction unit 110. A detailed description of magnetic resonance images and magnetic resonance imaging devices can be found in the book "Practical NMR Imaging, by M. A. Poster and J. M. S. Hutchison, 1987, IRL Press.

In order to execute a method in accordance with the invention, the known magnetic resonance imaging device 100 comprises a circuit 114 for executing a 1D Fourier transformation and a circuit 115 for determining a position from the result of the circuit 114. The position signal 118 supplied by the circuit 115 is applied, via the connection 116, directly to a control input 117 of the RF modulator 105. Also provided is a circuit 119 which determines a phase compensation signal 122 and a frequency compensation signal 123 from the position signal 118. Moreover, the demodulation unit 109 also comprises a phase compensation input 120 and a frequency compensation input 121, so that the received MR signals are compensated during the demodulation in dependence on the value of the phase compensation signal 122 and the frequency compensation signal 123.

Figure 2:
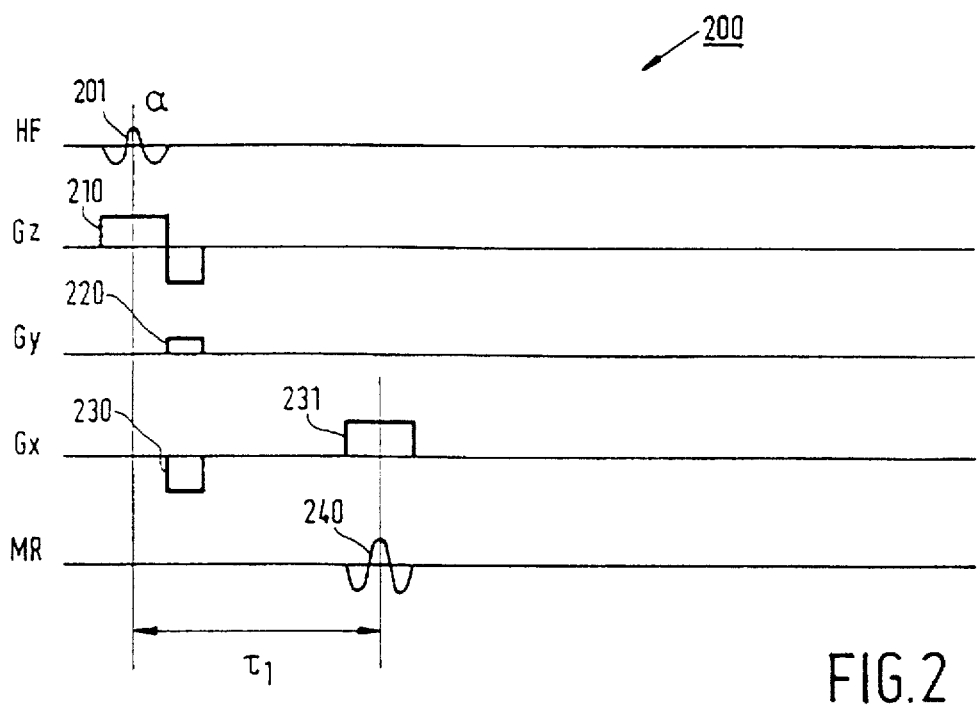
FIG. 2 shows a known pulse sequence for generating MR signals.

FIG. 2 shows an example of a known pulse sequence which is used to generate the MR signals 240 in an object or a body in order to execute, for example a two-dimensional Fourier imaging technique. The pulse sequence 200 commences with an excitation pulse 201 which has a flip angle $\alpha$. The flip angle $\alpha$ is, for example 90°. Immediately after the excitation pulse 201 a first temporary gradient field 230, dephases the spins. The second temporary gradient field 231 rephases the spins and a gradient echo signal 240 occurs after a desired period $\tau_1$ after the excitation pulse. Spatial encoding can be achieved in the echo signals for the entire slice by increasing the strength of the temporary magnetic gradient field $G_y$ in successive pulse sequences, for example in 256 steps from a minimum value to a maximum value.

Figure 3:
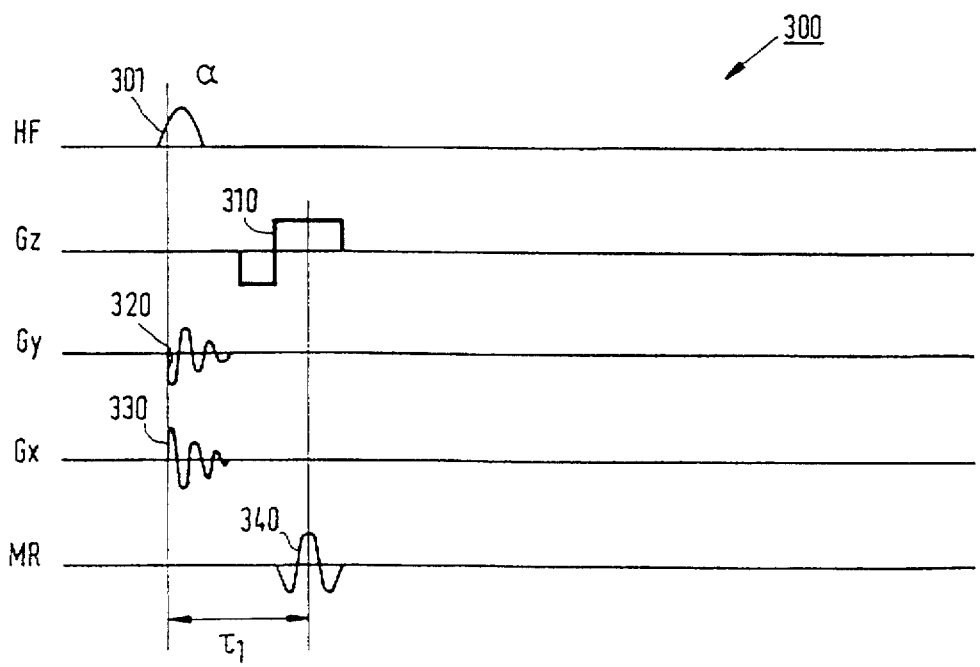
FIG. 3 shows an example of a pulse sequence for generating a 2D RF navigator signal.
Figure 4:
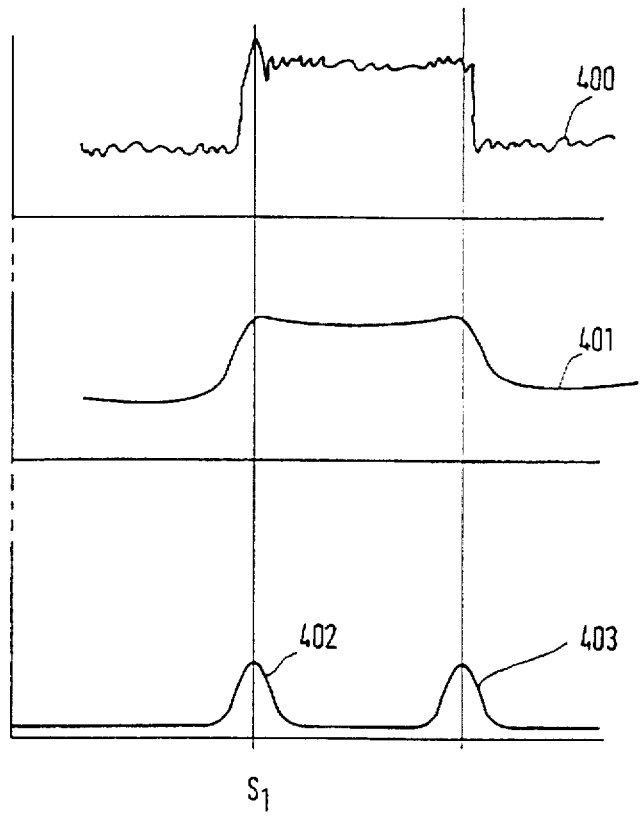
FIG. 4 shows a 1D proton density profile with a position of an edge derived therefrom.

According to the method of the invention navigator signals are generated to determine the position of a part to be imaged which moves in a first direction. To this end, the pulse sequences 300, to be described in detail with reference to FIG. 3, for generating navigator signals are arranged between a number of pulse sequences 200. The position determined from the navigator signal is used to adjust the pulse sequences 200 succeeding the navigator signal so as to generate echo signals in order to obtain imaging information concerning the moving part. FIG. 3 shows an example of a pulse sequence 300 for generating a 2D RF navigator signal 340. The navigator signal 340 is used to determine, for example a displacement in the z-direction. To his end, the navigator signal 340 is generated in a column of a moving heart and an adjoining part in the body 106. The pulse sequence 300 commences with an excitation pulse 301 which has a flip angle $\alpha$. The selective excitation of the column is achieved by application of a first temporary magnetic gradient field 320 and a second temporary gradient field 330 having gradients which extends substantially perpendicularly to the direction of motion. A detailed description on the modulation of the RF-pulses and temporary magnetic gradient fields to generate the 2D RF navigator signal in the column pointed in the z-direction can be found in the article "A k-space analysis of small tip angle excitation", by J. Pauli et al., published in Journal of Magnetic Resonance 1989, No 81, pp 43–56. The third temporary gradient field 310 first dephases and then rephase the spins to provide an in-phase condition and thus an MR signal at the desired time $\tau_1$, after the excitation pulse 301. The frequency modulation is achieved by continuation of the third temporary magnetic gradient field 310 during the reception of the navigator signal 340, the gradient of the temporary magnetic gradient field 310 being oriented in the direction of motion, in his case being the z-direction. Subsequently, the navigator signal 340 received is sampled in, for example 256 points, after which a 1D Fourier transformation is performed on the sampled navigator signal. A 1D proton density profile of the region is derived from the result of the 1D Fourier transformation. A reference point can be determined from the 1D proton density profile, for example by execution of an edge detection algorithm. FIG. 4 shows a 1D proton density profile 400 and the action of the edge detection algorithm. The edge detection algorithm consists of, for example a low-pass filter which is followed by a high-pass filter. The low-pass filter, for example a 20-pixel wide average digital filter, removes the noise from the 1D proton density profile 400. The high-pass filter, for example a 5-pixel digital filter, subsequently determines the edges 402, 403 present from the transitions in the filtered proton density profile 401. The edge 402 is, for example a transition between the heart and the surrounding tissue. The measured position $S_1$ of the edge 402 is subsequently used to adjust the pulse sequence 200.

In the device in accordance with the invention it is important that the speed of determination of the position $S_1$ is high, so that the region to be imaged is substantially the same as the excited region. Fast determination can be achieved, for example by executing the 1D Fourier transformation, the digital filtering operations and the determination of the position of the reference point in the separate electronic circuits 114, 115. These circuits may be digital circuits especially designed for this purpose or commercially available programmable digital processing units, provided with programs for executing the 1D Fourier transformation, the digital filters and the determination of the position of a reference point. The position thus determined for the region to be excited is converted into the position signal 118 which is subsequently applied, via a separate signal lead 116, directly to the specially provided control input 117 of the RF modulator 105. In order to generate RF pulses for tracking the slice to be imaged, the RF modulator 105 is set to a tracking state by a signal from the control unit 113. In response to a position signal 118 applied to the control input 117, the RF modulator 105 then adapts the frequency contents of the RF pulses of the pulse sequences, so that the position of the excited region corresponds to the position determined The described compensation is not adequate for a motion which is not substantially perpendicular to the slice to be imaged; this also requires a phase correction or a frequency correction of the MR signals received.

Figure 5:
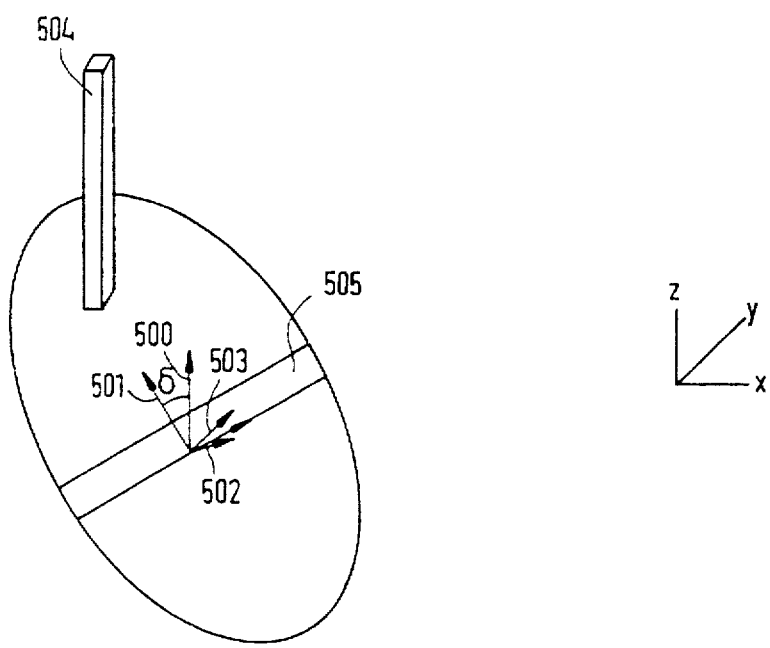
FIG. 5 shows a region to be imaged which encloses an angle relative to a direction of motion.
Figure 6:
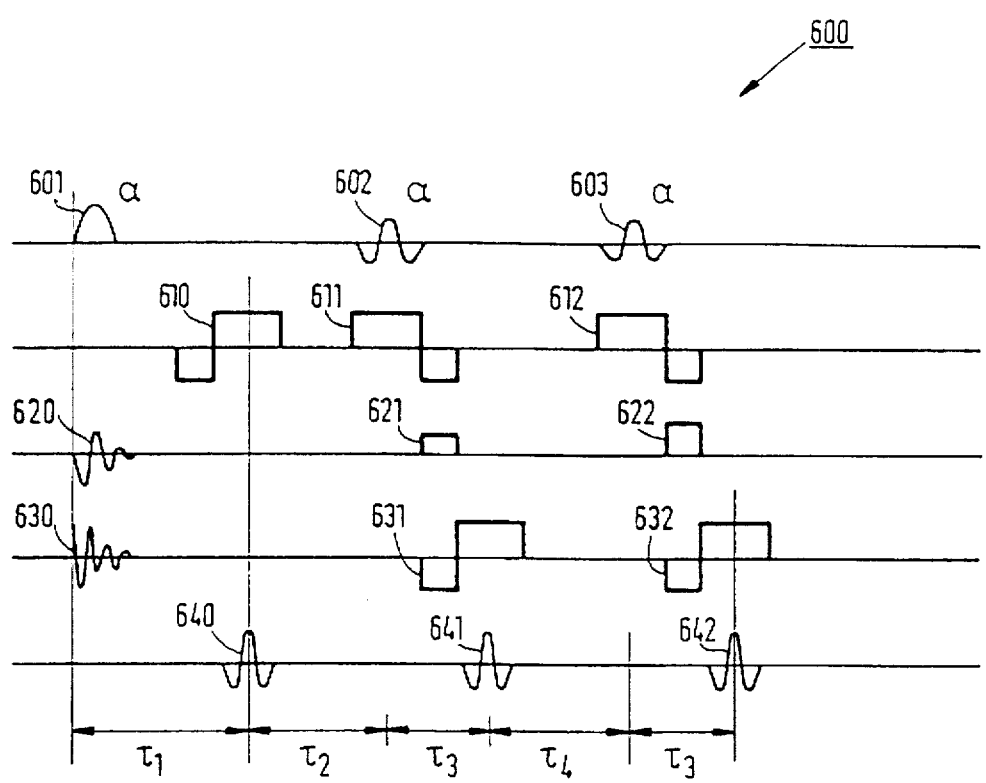
FIG. 6 shows a pulse sequence for generating a navigator signal and phase and frequency encoded MR signals.

FIG. 5 shows an example of a displacement 500 into the z-direction of a slice 505, for example of the heart 507, which slice encloses a direction $\delta$ relative to the z-axis of the MRI device 100. The displacement 500 has components 501,502 and 503 in three orthogonal directions; a first component having a direction perpendicular to the slice 505, a second component 502 having a first direction in the plane of the slice 505, and a third component 503 having a second direction in the plane of the slice 505 perpendicular to the first direction. The component 501 in the direction perpendicular to the slice 505 is compensated by a displacement of the region to be excited. The component 502 and the component 503 in the plane of the slice 505 can be corrected by way of a correction of the phase and frequency encoded MR signals. In order to determine a phase and frequency correction, 2D RF navigator signals are generated in the column 504. These navigator signals are generated by means of additional RF pulses and temporary magnetic gradient fields between the sequences, generating the phase and frequency encoded MR signals for deriving image information. The number of spatially encoded MR signals to be generated between two successive navigator signals is dependent on the speed of the moving part. From the navigator signal there is derived a frequency correction and a phase correction which are executed during the demodulation of the MR signal received. FIG. 6 shows an example of a pulse sequence 600 for generating a 2D RF navigator signal 640 and for generating a first phase and frequency encoded signal 641 and a second phase and frequency encoded signal 642 in a region to be imaged. The pulse sequence 600 commences with an excitation pulse 601 which has a flip angle $\alpha$. The selective excitation of the column is achieved by application of a first temporary magnetic gradient field 620 and a second temporary gradient field 630 having gradients which extends substantially perpendicularly to the z-direction. The third temporary gradient field 610 first dephases and then rephases the spins to provide an in-phase condition and thus an MR, signal at die desired time $\tau_1$ after the excitation pulse. The frequency modulation is achieved by continuation of the third temporary magnetic gradient field 610 during the reception of the navigator signal 640, the gradient of the temporary magnetic gradient field 610 being oriented in the direction of motion, in this case being the z-direction. A position signal 118 is determined from the navigator signal 640 successively by means of a 1D Fourier transformation in the circuit 114 and the execution of an edge detection algorithm in the circuit 115. The circuit 119 determines a frequency compensation signal 123 and a phase compensation signal 122 from the position signal 118, said frequency compensation signal being applied to the frequency compensation input 121 of the demodulation unit 109 and said phase compensation signal being applied to the phase compensation input 120 of the demodulation unit 109. These operations have to be performed within a time $\tau_2$. With the determined position a second excitation pulse 602 and after a period $\tau_3+\tau_4$ a third excitation pulse 603 are generated to select the slice to be imaged. In special occasions for example when the motion is in the plane of the slice to be imaged, adjustment of the position of the region to be excited will not be necessary. Repetition of the temporary gradient fields 631 and 632 first dephase and then rephase the spins and causes the appearance of a second echo signal 641 and a third echo signal 641 after a time $\tau_3$ after the excitation pulses 602 and 603. The phase encoding in the second echo signal 641 and the third echo signal 642 is applied by the temporary magnetic gradient fields 621 and 622, frequency encoding is applied by the continuation of the temporary magnetic gradient fields 631 and 632. In the demodulation unit 109 the second echo signal 641 and the third echo signal 642 are demodulated during which the frequency and phase correction is performed. In order to form an image, the pulse sequence 600 is repeated, the phase encoding then being adapted by way of tile intensity of the temporary magnetic gradient field 621, 622.

Furthermore, in order to reduce motion artifacts a cardiac triggering technique can be applied which counteracts motion artifacts caused by a complex cardiac motion According to the cardiac triggering technique, only a given periods the so-called acquisition period, of an ECG signal to be recorded is used to generate navigator signals and MR signals for forming images.

Figure 7:
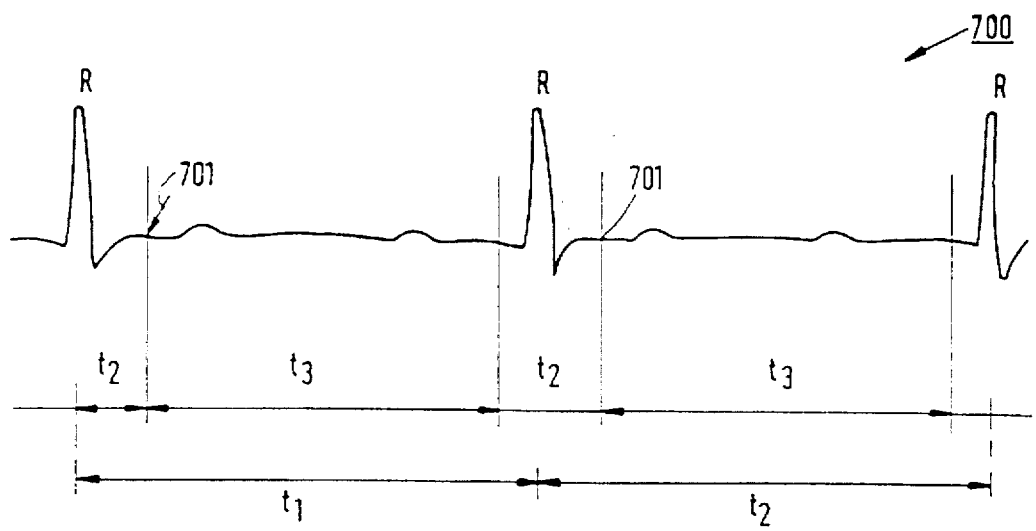
FIG. 7 shows an example of an ECG in which an acquisition period is indicated.

FIG. 7 shows an example of an ECG signal 700 of a patient having a cardiac cycle of, for example $t_1$ ms and an acquisition period $t_3$. The starting point 701 of the acquisition period is situated, for example $t_2$ ms after the R wave. The duration of the acquisition period is, for example $t_3$ ms. Outside the acquisition period no MR signals are generated to form images.

Furthermore, in order to reduce motion artifacts it is also possible to use respiration synchronization. Respiration synchronization is applied to counteract the motion artifacts caused by an irregular cardiac displacement which itself is caused by respiration. According to the respiration synchronization method, for example a part of the heart of a patient is used as a reference region which performs a cyclic motion within the patient due to the respiration.

Figure 8:
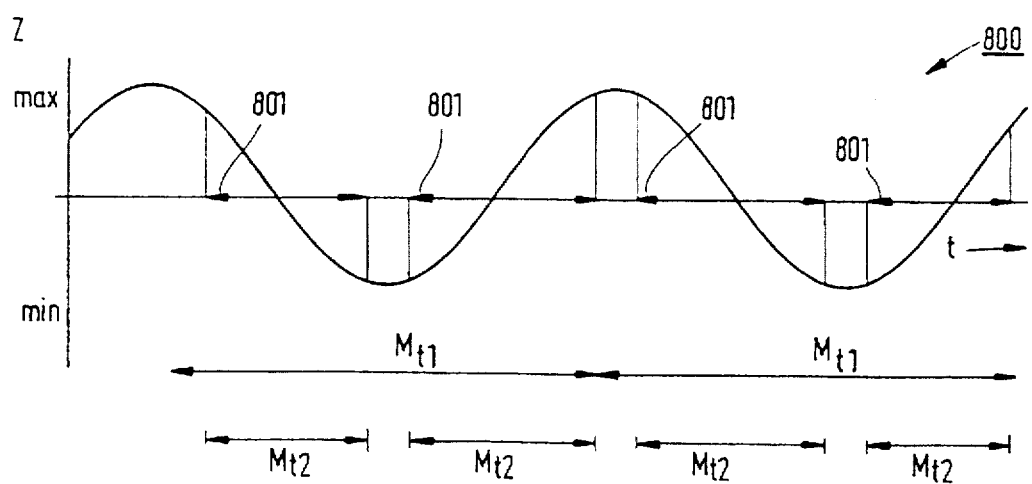
FIG. 8 shows an example of a respiratory motion.

FIG. 8 shows an example of a graph 800 in which the motion of the heart is plotted as a function of time. The motion period is, for example $M_{r1}$ seconds. The acquisition amounts to, for example $M_{r2}$ seconds, it being assumed that the heart moves substantially uniformly during the acquisition period $M_{r2}$. Furthermore, in order to determine the position of the heart use can be made of the navigator signal 640.

If desired, on the basis of the positions of parts of, for example the heart which have been determined by means of the navigator signals, other motion corrections can also be executed, for example a continuous rotation matrix adaptation or a continuous gradient intensity adaptation. The rotation matrix adaptation is applied to correct for a small heart rotation which also occurs during respiration. The gradient intensity adaptation is used to correct for the compression of the heart due to the respiration. When the linear volume compression is a factor f of the original volume, for example the slice thickness of the image is adapted by multiplying the intensity of the selection gradient by the factor 1/f.

We claim:

1. A method of forming magnetic resonance images of a moving part of a body, which part is arranged in a substantially uniform, steady magnetic field, said method comprising generating MR signals in the body by application of pulse sequences including RF pulses and temporary magnetic gradient fields, and subsequently reconstructing an image from position-dependent information in said MR signals, which method also comprises the following steps:
1) determining a position of the moving part,
2) adjusting a position of an image slice to be excited in the body within the uniform magnetic field in conformity with the position determined for the moving part,
3) exciting the image slice at the adjusted position to generate MR signals,
4) receiving and demodulating the MR signals generated in said image slice, and
5) processing the received and demodulated MR signals so as to form an image,
wherein in order to determine the position of the moving part the following sub-steps are executed:
a) separately exciting a part of the body indicative of a movement of the moving part to generate a navigator signal,
b) receiving the navigator signal, and
c) determining the position of the moving part from the received navigator signal.

2. A method as claimed in claim 1, wherein for the execution of a motion correction of a component of movement directed in the plane of the image slice, the following steps are also executed:
a) determining at least one of a phase correction and a frequency correction from the navigator signal received, and
b) executing the at least one of the phase correction and frequency correction on the received MR signals during the demodulating.

3. A method as claimed in claim 2, wherein in order to counteract motion artifacts caused by cardiac motion, an ECG is recorded in order to determine an acquisition period of the cardiac motion and said navigator signal and said MR signals are generated in the moving part exclusively during the acquisition period.

4. A method as claimed in claim 3, wherein in order to counteract artifacts caused by a recurrent motion in the body, MR signals are received exclusively during a period of the recurrent motion of a reference part of the body, the following steps being also executed:
a) generating further navigator signals in the reference part,
b) receiving the further navigator signals,
c) deriving positions of the reference part from the received further navigator signals, and
d) determining the period of recurrent motion from the derived positions of the reference part.

5. A method as claimed in claim 2, wherein in order to counteract artifacts caused by a recurrent motion in the body, MR signals are received exclusively during a period of the recurrent motion of a reference part of the body, the following steps being also executed:
a) generating further navigator signals in the reference part,
b) receiving the further navigator signals,
c) deriving positions of the reference part from the received further navigator signals, and
d) determining the period of recurrent motion from the derived positions of the reference part.

6. A method as claimed in claim 1, wherein in order to counteract motion artifacts caused by cardiac motion, an ECG is recorded in order to determine an acquisition period of the cardiac motion and said navigator signal and said MR signals are generated in the moving part exclusively during the acquisition period.

7. A method as claimed in claim 6, wherein in order to counteract artifacts caused by a recurrent motion in the body, MR signals are received exclusively during a period of the recurrent motion of a reference part of the body, the following steps being also executed:
a) generating further navigator signals in the reference part,
b) receiving the further navigator signals,
c) deriving positions of the reference part from the received further navigator signals, and
d) determining the period of recurrent motion from the derived positions of the reference part.

8. A method as claimed in claim 1, wherein in order to counteract artifacts caused by a recurrent motion in the body, MR signals are received exclusively during a period of the recurrent motion of a reference part of the body, the following steps being also executed:
a) generating further navigator signals in the reference part,
b) receiving the further navigator signals, c) deriving positions of the reference part from the received further navigator signals, and d) determining the period of recurrent motion from the derived positions of the reference part.

9. A method of forming magnetic resonance images of a moving part of a body, which part is arranged in a substantially uniform, steady magnetic field, said method comprising generating MR signals in the body by application of pulse sequences including RF pulses and temporary magnetic gradient fields, and subsequently reconstructing an image from position-dependent information in said MR signals, which method also comprises the following steps:

1) generating MR signals in an image slice in the body within the uniform magnetic field, 2) receiving and demodulating the MR signals generated in the image slice, and, 3) processing the received and demodulated MR signals so as to form an image, wherein in order to compensate for motion artifacts due to a component of movement of the moving part directed in the plane of the image slice the following sub-steps are executed:

a) generating a navigator signal in a part of the body indicative of a movement of the moving part, b) receiving the navigator signal, c) determining at least one of a phase correction and a frequency correction from the navigator signal received, and d) executing the at least one of a phase correction and a frequency correction on the received MR signals during the demodulating.

10. A method as claimed in claim 9, wherein in order to counteract motion artifacts caused by cardiac motion, an ECG is recorded in order to determine an acquisition period of the cardiac motion and said navigator signal and said MR signals are generated in the moving part exclusively during the acquisition period.

11. A method as claimed in claim 10, wherein in order to counteract artifacts caused by a recurrent motion in the body, MR signals are received exclusively during a period of the recurrent motion of a reference part of the body, the following steps being also executed:

a) generating further navigator signals in the reference part, b) receiving the further navigator signals, c) deriving positions of the reference part from the received further navigator signals, and d) determining the period of recurrent motion from the derived positions of the reference part.

12. A method as claimed in claim 9, wherein in order to counteract artifacts caused by a recurrent motion in the body, MR signals are received exclusively during a period of the recurrent motion of a reference part of the body, the following steps being also executed:

a) generating further navigator signals in the reference part, b) receiving the further navigator signals, c) deriving positions of the reference part from the received further navigator signals, and d) determining the period of recurrent motion from the derived positions of the reference part.

13. An MRI device for forming magnetic resonance images of a moving part of a body which is arranged in a substantially uniform, steady magnetic field, the device comprising:

a) means for sustaining the steady magnetic field, b) means for generating RF electromagnetic signals, c) means for generating temporary magnetic gradient fields, d) means for receiving, demodulating and sampling the MR signals, e) means for determining a position of a moving part of the body, f) a reconstruction unit for processing the sampled MR signals to form an image, and g) a control unit configured for generating control signals for said means for generating RF electromagnetic signals, said means for generating temporary magnetic gradient fields, and said means for determining position in order to cause execution of the following steps:

1) separately exciting a part of the body indicative of a movement of the moving part to generate a navigator signal, 2) receiving the navigator signal, 3) determining the position of the moving part from the received navigator signal, 4) adjusting a position of an image slice to be excited within the uniform magnetic field in conformity with the position determined for the moving part, 5) exciting the image slice at the adjusted position to generate MR signals and receiving the MR signals, and 6) processing the received MR signals so as to form an image.

14. An MRI device as claimed in claim 13, characterized in that the control unit comprises a circuit for executing a 1D Fourier transformation on the navigator signal received, and a circuit for deriving the position of the moving part from the Fourier-transformed navigator signal.

15. An MRI device as claimed in claim 14, wherein the means for generating RF pulses has a control input which is coupled to the means for determining the position of the moving part in order to produce a change of frequency of the generated RF pulses in response to the determined position of the moving part.

16. An MRI device as claimed in claim 14, wherein the means for determining the position of the moving part generates a control signal which is applied to a control input of the means for receiving, demodulating and sampling the MR signals in order to produce at least one of a phase correction and a frequency correction of the received, demodulated and sampled MR signals.

17. An MRI device as claimed in claim 13, further comprising a circuit for determining the position of the moving part, said position determining circuit generating a control signal which is applied to a control input of the means for generating RF pulses in order to produce a change of frequency of generated RF pulses in response to the determined position of the moving part.

18. An MRI device as claimed in claim 17, wherein said means for determining the position of the moving part comprises a circuit for executing a 1D Fourier transformation on the received navigator signal, and a circuit for deriving the position of the moving part from the Fourier-transformed navigator signal.

* * * * *